United States Patent [19]

Kuban et al.

[11] Patent Number: 4,744,049
[45] Date of Patent: May 10, 1988

[54] MICROCODE TESTING OF A CACHE IN A DATA PROCESSOR

[75] Inventors: John Kuban; Douglas B. MacGregor; Robert R. Thompson; David S. Mothersole, all of Austin, Tex.

[73] Assignee: Motorola, Inc., Schaumburg, Ill.

[21] Appl. No.: 97,277

[22] Filed: Sep. 17, 1987

Related U.S. Application Data

[63] Continuation of Ser. No. 660,586, Oct. 15, 1984, abandoned.

[51] Int. Cl.$^4$ .............................................. G06F 9/00
[52] U.S. Cl. ................................................... 364/900
[58] Field of Search .............................. 364/200, 900

[56] References Cited

U.S. PATENT DOCUMENTS

| | | |
|---|---|---|
| 4,167,779 | 9/1979 | Sullivan et al. .......... 364/200 |
| 4,190,885 | 2/1980 | Joyce et al. ............. 364/200 |
| 4,357,656 | 11/1982 | Saltz et al. ............. 364/200 |
| 4,392,201 | 7/1983 | Brown et al. ............ 364/200 |
| 4,488,228 | 12/1984 | Crudele et al. .......... 364/200 |
| 4,493,035 | 1/1985 | MacGregor et al. ....... 364/200 |
| 4,524,415 | 6/1985 | Mills, Jr. et al. ....... 364/200 |
| 4,575,792 | 3/1986 | Keeley ................... 364/200 |

Primary Examiner—Gareth D. Shaw
Assistant Examiner—John G. Mills, III
Attorney, Agent, or Firm—John A. Fisher; Jeffrey Van Myers

[57] ABSTRACT

In a microcoded data processor, an instruction is provided which enables the microaddress for the micromachine to be externally specified. By way of this instruction, the processor may be directed to execute special microcoded routines otherwise unavailable during normal execution. These special microcoded routines may perform useful functions such as testing in an expeditious manner portions of the circuitry of the processor which would otherwise be difficult to test. For example, the functionality of regular structures such as instruction decoding and control programmable logic arrays (PLA's) may either be gated directly out to the tester or internally analyzed before the accumulated results are presented to the tester. On-board instruction caches may also be efficiently exercised to verify that the tag portion properly determines "hits" and "misses", and that the actual instruction cache portion functions accurately.

1 Claim, 4 Drawing Sheets

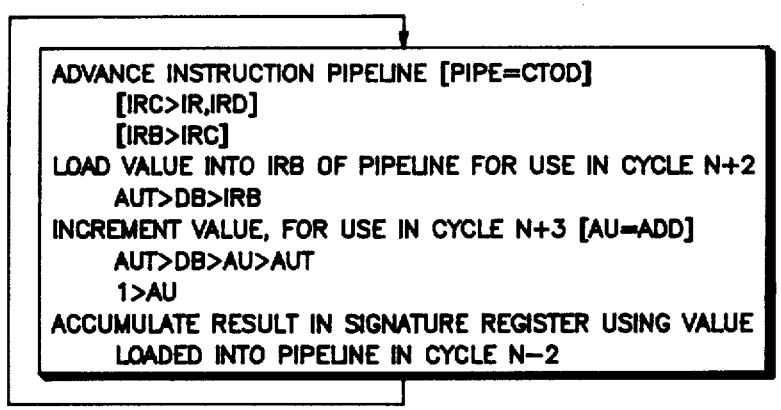
FIG. 2
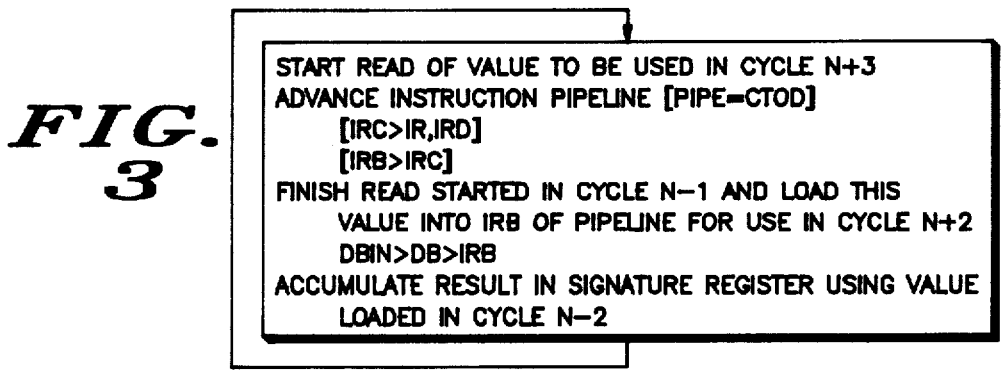
FIG. 3
FIG. 5
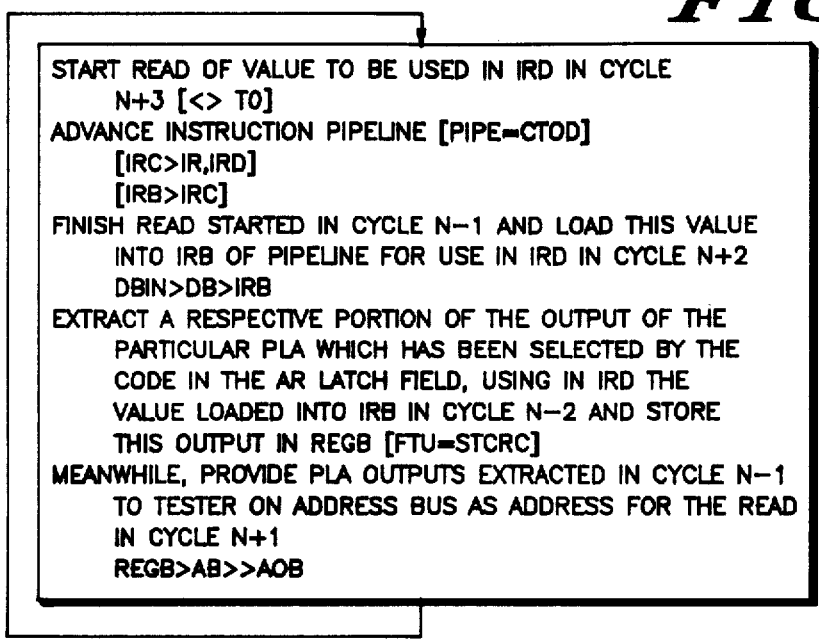

MICROCODE TESTING OF A CACHE IN A DATA PROCESSOR

This is a continuation of application Ser. No. 660,586, filed Oct. 15, 1984 now abandoned.

CROSS REFERENCE TO RELATED APPLICATIONS

Related subject matter is disclosed in the following applications filed simultaneously herewith and assigned to the assignee hereof:

1. U.S. patent application Ser. No. 660,587, entitled Direct Entry into the Microcode of a Data Processor, inventors Douglas B. MacGregor, William C. Moyer, John Zolnowsky and David S. Mothersole.

2. U.S. patent application Ser. No. 660,590, now abandoned, entitled Micocode Testing of PLA's in a Data Processor, inventors Robert W. Aaron, John Kuban, Douglas B. MacGregor and Robert R. Thompson.

FIELD OF THE INVENTION

The present invention relates generally to testing of a data processor to determine functionality, and, more particularly, to the testing of a microcoded data processor.

BACKGROUND OF THE INVENTION

In general, data processors are tested throughly by the manufacturer before being shipped to the end user thereof. The manufacturer's goal is to test each processor to a specific standard of functionality in the most efficient and cost effective way. Ideally, each processor would be required to correctly execute a carefully designed sequence of instructions selected to utilize substantially all of the circuitry contained within the processor. However, as the instruction set expands, the cost of such exhaustive testing soon becomes prohibitive. Instead, dedicated test circuitry is included within the processor so that those portions of the processor which are too difficult or time consuming to test implicitly may be explicitly tested by a suitable automated tester. If the processor is particularly powerful, the cost of providing the testing circuitry may even exceed the value of the functions being tested. If such functions are otherwise essential, the manufacturer's task becomes one of selecting the most cost effective way of testing that function.

SUMMARY OF THE INVENTION

It is an object of the present invention to provide a very cost effective way to test an instruction cache of a microcoded data processor.

Another object of the present invention is to provide a technique for a microcoded data processor to test an instruction cache using microcoded test routines.

In carrying out these and other objects of the present invention, there is provided, in one form, a microcoded data processor having an instruction cache and a cooperating tag cache. In accordance with the present invention, the processor includes a special microroutine adapted to cyclically provide as a data address a first value, accept as a data operand and a second value, and then use the second value to access the instruction cache via the tag cache. If there is no "hit" in the tag cache, the microroutine provides the second value as an instruction address, accepts as an instruction operand a third value (the third value being automatically loaded into the instruction cache concurrent with the second value being loaded into the tag cache), and then substitutes the third value for the first value. If there is a "hit" in the tag cache, the microroutine substitutes for the first value the third value provided by the instruction cache in response to the second value "hitting" in the tag cache. In this manner, the processor may test the functionality of the cache.

BRIEF DESCRIPTION OF THE DRAWINGS

FIG. 2 is a flow diagram of one microcoded test routine for testing a first portion of the instruction decoding circuitry of the processor of FIG. 1.

FIG. 3 is a flow diagram of another microcoded test routine for testing the first portion of the instruction decoding circuitry of the processor of FIG. 1.

FIG. 5 is a flow diagram of a set of microcoded test routines for testing a third portion of the instruction decoding circuitry of the processor of FIG. 1.

DESCRIPTION OF THE INVENTION

Figure 1:
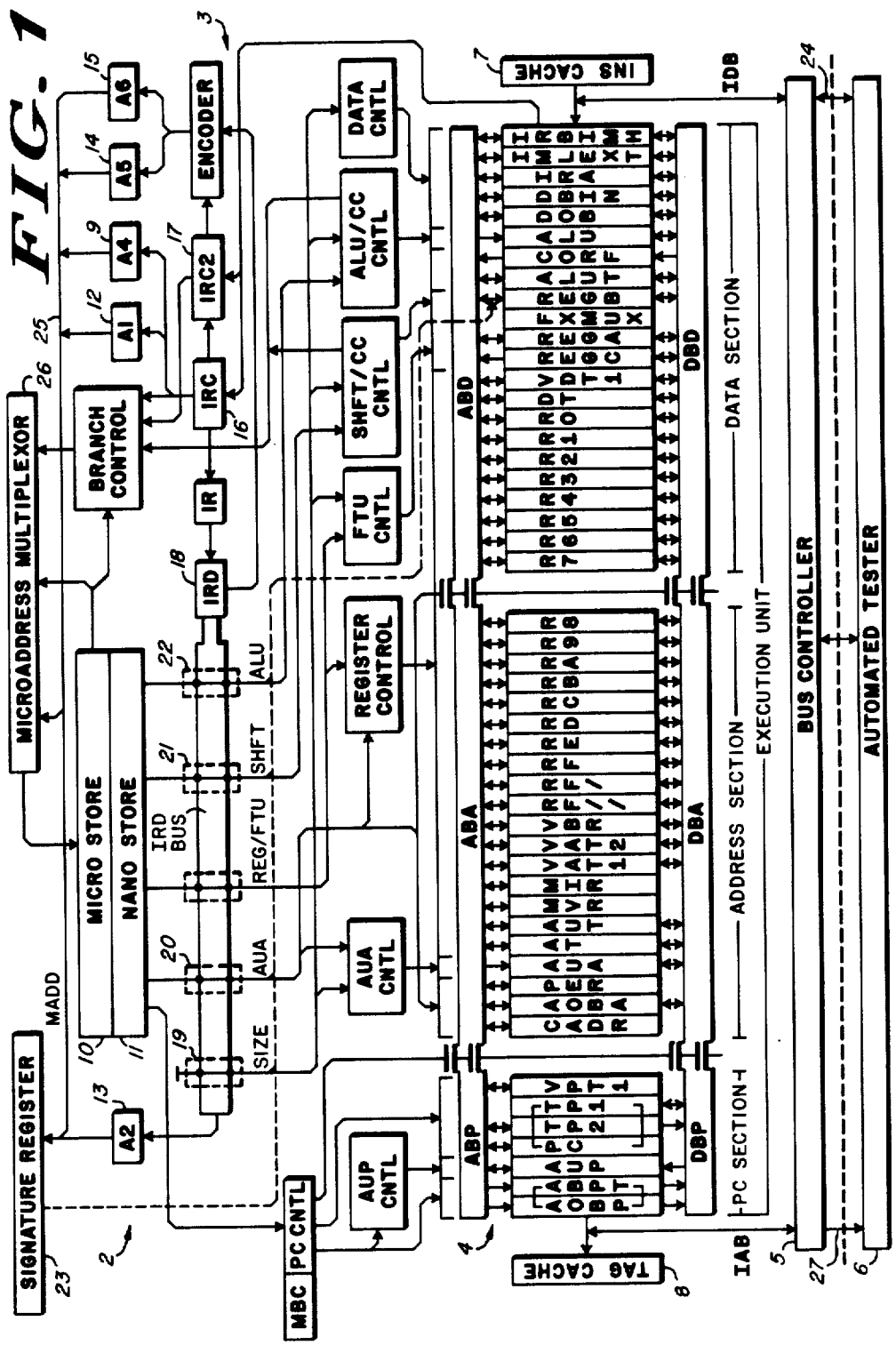
FIG. 1 is a block diagram of a microcoded data processor adapted to practice the present invention.

Shown in FIG. 1 is a microcoded data processor 1 similar to that shown and described in U.S. Pat. No. 4,488,228, entitled "Virtual Memory Data Processor". In general, the processor 1 includes a micromachine 2 responsible for accomplishing the execution of instructions received via an instruction pipeline 3, using a segmented execution unit 4. A bus controller 5 cooperates with the micromachine 2 in transferring the instructions and any necessary data operands between the processor 1 and external resources such as an automated tester 6. To reduce bus bandwidth requirements and to increase execution speed, processor 1 includes an instruction cache 7 which cooperates with a set associative tag cache 8 to provide a local store for recently used instructions or portions thereof.

Since most of the details of the construction and operation of the processor 1 are beyond the scope of the present invention, only relevant portions will be described herein. However, a more complete description of the bus controller 5 may be found in U.S. Pat. No. 4,633,437 and in copending U.S. Application Ser. No. 655,015. A description of the instruction pipeline 3 may be found in copending U.S. Application Ser. No. 625,066, now abandoned. The automated tester 6 may be any of a number of commercially available units such as the GenRad Model GR16.

As described in U.S. Pat. No. 4,488,228, the processor 1 is adapted to respond to certain types of error conditions by stacking off a block of information relating to its internal state before vectoring to an appropriate error handler. Typically, after the cause of the error has been corrected, the error handler executes a special "ReTurn from Exception" (RTE) instruction which restores the state using the stacked information and then allows the processor 1 to resume execution from the precise point in the instruction execution sequence at which the error was detected.

For the purposes of the present invention, the most important item of information which is stored on the stack is the current value of the microaddress program counter (MICRO PC). During the restore operation, this value is loaded into the A4 latch 9 and then used by the micromachine 2 to select for execution the next microinstruction in micro store 10 and nano store 11. During normal execution, if the value which is restored is not the same as the value which was stored, the processor 1 will be unable to properly resume execution of the faulted instruction. Thus, the user must take particular care in assuring that this portion of the stacked information is unchanged during the error handling procedure. On the other hand, as explained in U.S. Pat. No. 4,524,415, certain portions of the stacked information may be precisely changed so that the processor 1 will resume execution of the faulted instruction in a alternative manner. In general, except for such predefined changes, no other changes may be made in the stacked information without affecting the operation of the processor 1 in an undefined manner.

In the course of designing the processor described in U.S. Pat. Nos. 4,488,228, 4,524,415 and 4,493,035, it was realized that the processor described therein possessed the inherent ability to restore itself such that it would resume execution with any of the plurality of microinstructions. However, due to restrictions on the size of the micro store 10 and the nano store 11, this capability was never utilized to perform a useful function. When the processor 1 was thereafter taken up for design, it soon became evident that the enhanced functionality very significantly increased the testability problem. Although most of this increased power could be tested in a cost effective manner using conventional test procedures or special purpose test logic, certain areas of the circuitry of the processor 1 were particularly difficult or expensive to test with such techniques. It was therefore proposed that special microinstruction sequences be provided in the micro store 10 and nano store 11 to exercise dedicated test logic incorporated elsewhere in the processor 1. In this manner, not only were there significant reductions in the size of such test logic, but also in the time requried to test the respective areas of circuitry in the processor 1.

Upon carefully examining the internal architecture and circuit arrangement within the processor 1, it was discovered that only a relatively few of the major circuit components were amenable to testing using microcoded test routines: the primary sequencing "Programmable Logic Arrays" (PLA's) A1 12, A2 13, A5 14 and A6 15 which decode the contents of the IRC 16, IRC2 17 and IRD 18 comprising the instruction pipeline 3; the residual control decode PLA's 19, 20, 21 and 22 (typical of a total of eight, all of which are not shown for convenience) which decode the current instructions in IRD 18; and the instruction and tag caches 7 and 8, respectively. Other areas of the processor 1 proved to be more efficiently tested either functionally using macroinstruction sequences, or explicitly using relatively conventional test circuitry such as an on-board signature analysis register 23. At the same time, the presence of the signature analysis register 23 makes it all the more efficient to test using microcoded test routines.

In preparation for testing the primary sequencing PLA's 12–15, the tester 6 must prepare a stack frame having all of the information necessary for the processor 1 to restore a valid state, in the format illustrated in Appendix I hereto. In the MICRO PC field, the tester 6 will insert the address within the micro store 10 and nano store 11 of one of the three (3) microinstructions shown in Appendix II hereto. In addition, the testor 6 must insert into the AR LATCH portion of the SSWI field, a code which indicates an appropriate one of the several primary sequencing PLA's 12–15 to be tested. The tester 6 should also insert a suitable initial starting value, say zero (0), for the particular PLA test into the [AUT.H:AUT.L]field. Similarly, other suitable values should be inserted into the IRD, IR, IRC and IRC2 fields so that the line will be initialized properly. If appropriate for the selected test routine, as explained below, the tester 6 must also set the CRC field in the SSWI to enable the signature register 23. Thereafter, at the appropriate point in a testing sequence, the tester 6 then provides an RTE instruction in the instruction stream of the processor 1 via the data bus 24.

If, for example, the tester 6 chooses to insert into the stack frame the address of the first microinstruction shown in Appendix II, the processor 1, upon executing the RTE instruction, will proceed as illustrated in FIG. 2 by advancing the pipeline 3 before loading the specified initial value into the instruction pipe 3. Depending upon the AR LATCH code, either PLA A1 12 or A2 13 will provide a "microaddress" to the signature register 23 on the Microaddress ADDress (MADD) bus 25. Ignoring this microaddress, the micromachine 2 instead branches directly back to the current microinstruction using a direct branch path through the microaddress multiplexor 26. In this manner, the processor 1 will continue looping on this one microinstruction, incrementing each time the value which is loaded into the instruction pipeline 3. After a suitable number of cycles, the tester 6 can terminate the looping by resetting the processor 1. Coming out of reset, the processor 1 automatically transfers the residue in the signature register 23 into REGB in the data section of the execution unit 4 and then into AUT in the address section of the execution unit 4. The tester 6 may obtain this residue by simply forcing a bus error on the first bus cycle after reset so that the processor 1 will stack off all of the internal state information, including AUT. Using this microinstruction, the testor 6 can very rapidly verify exhaustively the functionality of each of the primary sequencing PLA's A1 12 through A4 15.

If, on the other hand, the tester 6 chooses to insert into the stack frame the address of the second microinstruction shown in Appendix II into the MICRO PC field, the processor 1 will proceed as illustrated in FIG. 3 by advancing the pipeline 3 before loading into the instruction pipe 3 a value which is provided by the tester 6 via the data bus 24. Again, depending upon the AR LATCH code, either PLA A1 12 or A2 13 will provide a "microaddress" to the signature register 23 on the MADD bus 25. Ignoring this microaddress, the micromachine 2 will instead branch directly to the current microinstruction using the direct branch path through the microaddress multiplexor 26. In this manner, the processor 1 will continue looping on this microinstruction, accepting each time the value which is to be loaded into the instruction pipeline 3. After a suitable number of cycles, the tester 6 can terminate the looping by resetting the processor 1 and then force the bus error so that the processor 1 will stack off the residue. Thus, by using this microinstruction, the tester 6 can selectively verify the functionality of the primary sequencing PLA's A1 12 and A2 13.

Figures 4, 7:
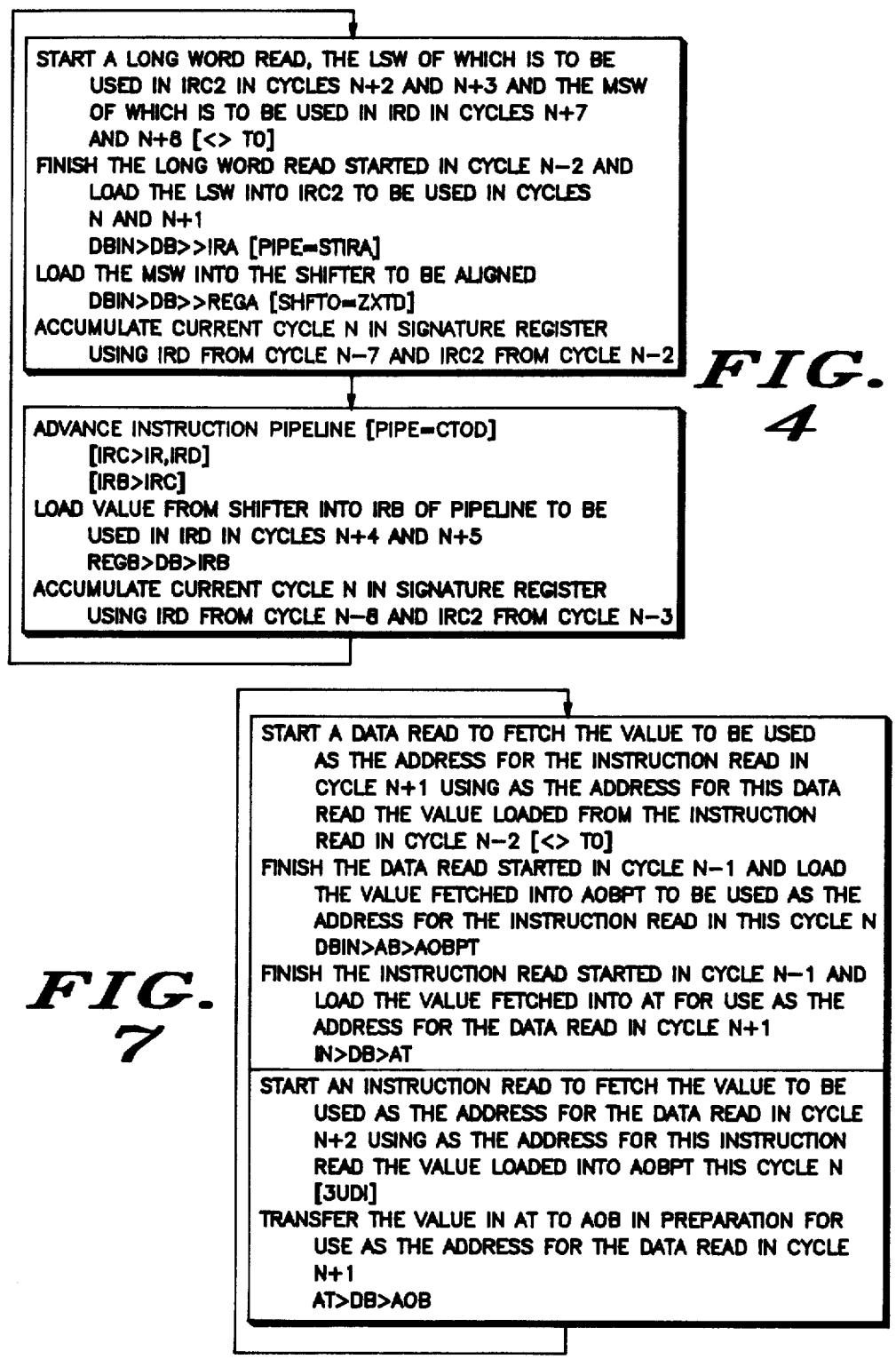
FIG. 4 is a flow diagram of a microcoded test routine for testing a second portion of the instruction decoding circuitry of the processor of FIG. 1.
FIG. 7 is a flow diagram of a microcoded test routine for testing the instruction cache of the processor of FIG. 1.

If, instead, the tester 6 chooses to insert into the stack frame the address of the third microinstruction sequence shown in Appendix II into the MICRO PC field, the processor 1 will proceed as illustrated in FIG. 4 to accept from the tester 6 via the data bus 24 a specific pair of values to be loaded into IRC2 17 and IRD 18 in the instruction pipeline 3. In the first microinstruction in this sequence, the processor 1 will load the new IRC2 value directly into IRC2 17, and enable the shifter FXMUX in the data section of the execution unit 4 to realign the new IRD value. In the next microinstruction in this sequence, the processor 1 will load the new IRD value into the pipeline 3. During the execution of each microinstruction, the "microaddress" provided by the selected PLA A5 14 or A6 15 is accumulated by the signature register 23. Since the new IRC2 and IRD values are loaded every other microinstruction cycle in a staggered sequence, the effect of each on the selected PLA is accumulated twice by the signature register 23. After allowing the processor 1 to continue repeating this sequence of two microinstructions for an appropriate number of microinstruction cycles, the tester 6 can reset the processor 1 and obtain the residue in the signature register 23. Using this short sequence of microinstructions, the tester 6 can selectively verify the functionality of the primary sequencing PLA's A5 14 and A6 15.

In preparation for testing the residual control PLA's 19–22, the tester 6 must also produce a stack frame having all of the information necessary for the processor 1 to restore a valid state, in the format illustrated in Appendix I hereto. In the MICRO PC field, the tester 6 may insert the address within the micro store 10 and nano store 11 of one of the seven (7) microinstructions shown in Appendix III hereto. In addition, the tester 6 must insert into the AR Latch portion of the SSWI field, a code which indicates which portion of the several residual control PLA's 19–22 is to be tested. Thereafter, at the appropriate point in the testing sequence, the tester 6 then provides the RTE instruction in the instruction stream of the processor 1 via the data bus 24.

Figure 6:
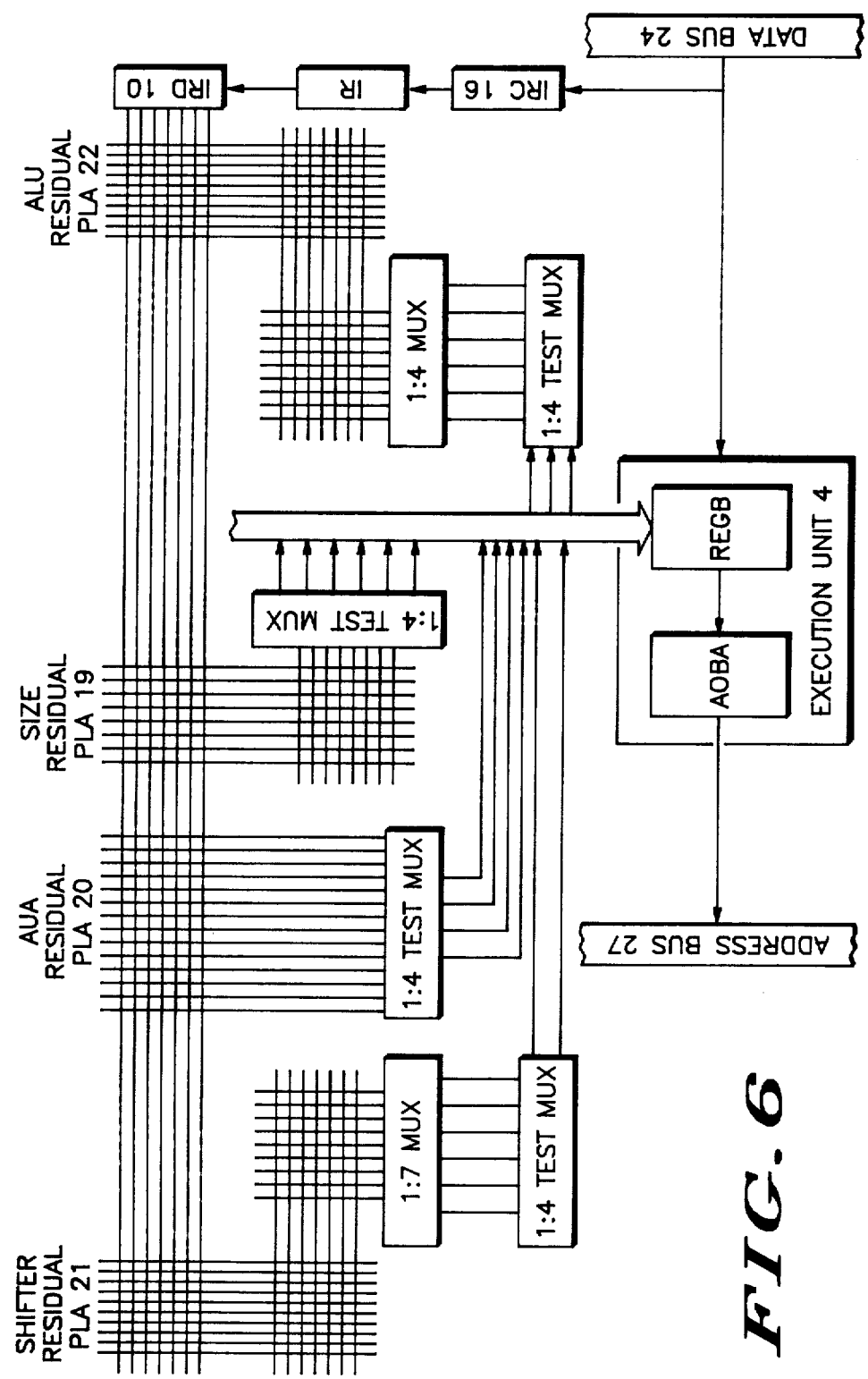
FIG. 6 is a schematic diagram illustrating special test circuitry for providing multiplexed access to the numerous control signals produced by a third portion of the instruction decoding circuitry of the processor of FIG. 1 during the execution of the microcoded test routines of FIG. 5.

Regardless of which address the tester 6 chooses to insert into the MICRO PC field in the stack frame from among those of the microinstructions shown in Appendix III, the processor 1 will proceed as illustrated in FIG. 5 to read from the tester 6 via the data bus 24 a specific value to be loaded into the instruction pipeline 3. The processor 1 will then extract via special 7-way multiplexing circuitry, such as that shown by way of illustration in FIG. 6, the selected portion of the resulting outputs of the several PLA's 19–22 and store these outputs in REGB in the data section of the execution unit 4. Simultaneously, the processor 1 will provide the outputs stored during the last execution of this microinstruction to the tester 6 via the address bus 27 just as if these outputs constituted the "address" for the next read bus cycle. Thereafter, the processor 1 will continue looping on this microinstruction, reading each time the next value from the tester 6 via the data bus 24, until reset by the tester 6. By successively using each of these microinstructions, the tester 6 can selectively verify the functionality of the residual control PLA's 19 through 22.

In preparation for testing the instruction and tag caches 7 and 8, respectively, the tester 6 must prepare a valid stack frame, with the address of the first microinstruction in Appendix IV hereto in the MICRO PC field. At the appropriate point in the testing sequence, the tester 6 may thereafter provide the RTE instruction in the instruction stream of the processor 1 via the data bus 24. In response, the processor 1 will initiate a data operand cycle, providing via the address bus 27 a "data address" value which has been initialized by the tester 6 in the AOB field of the stack frame. The processor 1 will then accept from the tester 6 via the data bus 24 and "instruction address" value. Using this "instruction address" value, the processor 1 attempts to access the instruction cache 7 via the tag cache 8. Since both the instruction cache 7 and the tag cache 8 will be initially empty, there should be no "hit" in the tag cache 8. The processor 1 will therefore automatically initiate an instruction operand cycle, providing the "instruction address" value on the address bus 27. The processor 1 will then accept from the tester 6 via the data bus 24 an "instruction" value. Since the instruction access "missed", the instruction cache 7 will automatically load this "instruction" value while the tag cache 8 concurrently loads the corresponding "instruction address" value. After substituting this new "instruction" value for the current "data address" value, the processor 1 repeats the cycle. By returning an appropriate sequence of values, the tester 1 can induce the processor 1 to sequentially fill up both the instruction cache 7 and the tag cache 8. If the tester 6 then provides in response to a subsequent data operand cycle an "instruction address" value which causes a "hit" in the tag cache 8, the processor 1 will substitute the corresponding "instruction" value retrieved from the instruction cache 7 for the current "data address" value and then proceed to the next cycle. In this manner, the tester 6 can determine the functionality of the instruction cache 7 by comparing the "instruction" values which should have been loaded into the instruction cache 7 to the "data addresses" which are provided for the respective data operand cycles. Similarly, the tester 6 can determine the functionality or the tag cache 8 by verifying that the "data addresses" and "instruction addresses" are as they should be if the tag cache 8 "hits" of "no hits", respectively.

Although the present invention has been described in the context of testing certain portions of the circuitry of the data processor 1, it will be apparent that other portions may also be tested efficiently using this technique in processors having suitable circuit configurations. In addition, the mechanism for providing direct entry into the microcode may be employed advantageously in other applications. For example, a special microroutine may be provided to implement an instruction not available in the standard instruction set. This special instruction may be a modified form of an existing instruction or one which is unique to a particular class of application or customer. In such situations, the microcode will be appropriately constructed to implement the desired functionality. The general format for such microinstructions, including those set forth in Appendices II through IV, is shown in Appendix V.

We claim:

1. In a microcoded data processor having:
an address port for providing instructions and data addresses;

an operand port for receiving instructions and data operands;

an instruction cache for temporarily storing instruction operands received via the operand port; and a tag cache for temporary storing the instruction addresses of each of the instruction operands stores in the instruction cache;

a method for recursively testing the operation of the instruction and tag caches, comprising the steps of:

providing as a data address a first value as one of said data addresses via said address port;

receiving as a data operand a second value as one of said data operands via said operand port;

using said second value to access said instruction cache via said tag cache;

when on a first condition that an instruction address having said second value is not stored in said tag cache then;

(1) providing said second value as an instruction address via said address port;

(2) receiving a third value as one of said instruction operands via the operand port;

(3) storing said third value in said instruction cache as one of said instruction operands concurrent with storing said second value in said tag cache as a respective instruction address; and (4) substituting said third value for said first value during the next recursion; and when on a second condition that an instruction address having said second value is stored in said tag cache, then;

(1) substituting for said first value during the next recursion the third value stored as an instruction operand in said instruction cache which corresponds to the instruction address stored in the tag cache having said second value;

whereby the instruction and tag caches may be tested by:

(1) providing a predetermined sequence of said second and third values to said data processor via said operand port, and (2) comparing each of said first values provided by said data processor via said address port to selected ones of said second and third values via said operand port;

so that the instruction and tag caches are tested by using only the address and operand ports.

* * * * *